United States Patent [19]

Bakermans et al.

[11] Patent Number: 4,513,353
[45] Date of Patent: Apr. 23, 1985

[54] CONNECTION OF LEADLESS INTEGRATED CIRCUIT PACKAGE TO A CIRCUIT BOARD

[75] Inventors: Johannes C. W. Bakermans, Harrisburg, Pa.; Dimitry G. Grabbe, Lisbon Falls, Me.; Iosif Korsunsky, Harrisburg, Pa.

[73] Assignee: AMP Incorporated, Harrisburg, Pa.

[21] Appl. No.: 453,074

[22] Filed: Dec. 27, 1982

[51] Int. Cl.³ .............................................. H05K 1/18
[52] U.S. Cl. ............................. 361/399; 174/52 FP; 174/68.5; 339/17 CF; 361/403
[58] Field of Search .................... 174/68.5, 52 FP; 361/403, 399; 339/17 CF

[56] References Cited

U.S. PATENT DOCUMENTS

| | | | |
|---|---|---|---|
| 2,938,068 | 5/1960 | Silverschotz | 174/68.5 X |
| 3,930,115 | 12/1975 | Uden et al. | 174/52 FP |
| 3,982,159 | 9/1976 | Dennis et al. | 361/403 |
| 4,303,291 | 12/1981 | Dines | 174/68.5 X |
| 4,359,252 | 11/1982 | Olsson et al. | 339/17 CF |
| 4,410,927 | 10/1983 | Butt | 361/403 X |
| 4,417,778 | 11/1983 | Halvorsen | 339/75 MP X |

Primary Examiner—R. R. Kucia
Attorney, Agent, or Firm—Donald M. Boles

[57] ABSTRACT

A device for connecting leadless integrated circuit packages to a chip carrier housing or socket and then to a printed circuit board is taught. Briefly stated, a mask is selectively disposed on a printed circuit board. Locating ribs are correspondently disposed on a chip carrier housing so as to cooperatively engage the slots created by the absence of the mask on the printed circuit board. Additionally, barriers for separating contacts contained in the chip carrier housing are maintained at the interior and the exterior portion of the chip carrier housing walls with no material disposed therebetween thereby minimizing capacitive as well as inductive effects which may come about. Additionally, four discrete interlocking brackets are disposed on top of the chip carrier housing which allow for complete assembly of the chip carrier to the printed circuit board before mating of an integrated circuit chip with the retaining brackets then interlocked so as to relatively rigidly maintain a chip carrier in electrical contact with the contacts. The present device therefore allows for relatively fast accurate alignment of all attendant contact surfaces.

7 Claims, 5 Drawing Figures

CONNECTION OF LEADLESS INTEGRATED CIRCUIT PACKAGE TO A CIRCUIT BOARD

This invention relates, generally, to integrated circuit chip carriers and more particularly to a device for connecting leadless integrated circuit packages to a chip carrier and thence to a printed circuit board.

While modern automated methods for manufacturing integrated circuits have allowed significant cost reductions to be realized, the problem of packaging such circuits in a cost effective manner continues to contribute significantly to the price of a finished product. A number of methods or techniques have been utilized for interconnecting integrated circuits to the outside world such as through the use of sockets, direct bonding to printed circuit boards as well as utilization of chip carriers which are then mated to circuit boards. The latter technique is prevalent particularly in the use of large scale or very large scale integrated circuits. Accordingly, a number of chip carrier type devices have been utilized to accomplish this purpose. An example of this art may be found in U.S. Pat. No. 4,268,102 "Low Impedance Electrical Connecting Means For Spaced-Apart Conductors" issued May 19, 1981 to Grabbe; U.S. Pat. No. 4,130,327 "Electrical Connector Having A Resilient Cover" issued Dec. 19, 1978 to Spaulding; U.S. Pat. No. 4,116,519 "Electrical Connections For Chip Carriers" issued Sept. 26, 1978 to Grabbe et al; U.S. Pat. No. 4,056,681 "Self Aligning Package For Integrated Circuits" issued Nov. 1, 1979 to Cook, Jr.; U.S. Pat. No. 4,035,046 "Miniature Electrical Connector For Parallel Panel Members" issued July 12, 1977 to Kloth; and U.S. Pat. No. 3,940,786 "Device For Connecting Leadless Integrated Circuit Package To A Printed Circuit Board" issued Feb. 24, 1976 to Scheingold et al. As evidenced by the previously mentioned art as well as being commonly known to those skilled in the art, precise, repeatable, and cost effective ways to interconnect an integrated circuit to a printed circuit board has been a continuing problem. Additionally, with the onslaught of extremely high speed as well as extremely dense integrated circuitry, the physical positioning of contacts in side-by-side relation to each other so as to interconnect an integrated circuit with a circuit board becomes a very complex problem.

It is desirable to have a device which allows the positioning of a chip carrier housing to a printed circuit board in a precise manner which is relatively simple to use, while providing good tactile feel as well as visual control. It is also desirable to have a chip carrier housing which minimizes the effects of stray capacitance and/or inductance associated with highly densely packed large and/or high speed integrated circuitry. It is also desirable to have a device which allows an integrated circuit to be retained in a chip carrier housing which does not require a plurality of contemperaneously performed fastening functions. Such a scheme is taught in the present invention.

Accordingly, the present invention relates to a device for connecting a leadless integrated circuit chip carrier or package to a circuit board comprising a circuit board having electrical conductors contained thereon, a mask disposed on the circuit board thereby covering the electrical conductors contained thereon, the mask being selectively omitted from portions of the circuit board thereby leaving exposed contact areas as well as at least one portion thereby defining a rib locating slot, a generally rectangular chip carrier housing disposed on the circuit board for receiving a leadless integrated circuit package, the chip carrier housing having outer walls and interior walls, the interior walls attached to the outer walls at each corner of the chip carrier, outer interior spacing barrier walls in opposing relationship to each other disposed perpendicularly to the outer and interior walls, thereby defining a slot for receiving an electrically conductive contact and for minimizing stray inductance and capacitance between electrical contacts disposed in the adjacent slots, an electrically conductive contact disposed in the slots for providing electrical communication between a leadless integrated circuit chip carrier and electrical conductors contained on the circuit board, at least one locating rib disposed on the chip carrier housing for engageably engaging the rib locating slot thereby allowing proper alignment of the contacts contained in the carrier housing with electrical conductors contained on the circuit board, and a plurality of chip carrier retaining brackets disposed on the carrier housing for maintaining conductors contained on the integrated circuit chip carrier in aligned electrical contact with the contacts contained in the chip carrier housing, the retaining brackets being generally rectangular and each of which is pivotally attached at one end to the chip carrier housing and having latching slots at the remaining end for interlocking with the pivot point of adjacent chip carrier retaining brackets.

BRIEF DESCRIPTION OF THE DRAWINGS

Reference is now made to the description of the preferred embodiment illustrated in the accompanying drawings, in which.

DESCRIPTION OF THE PREFERRED EMBODIMENT

Figure 1:
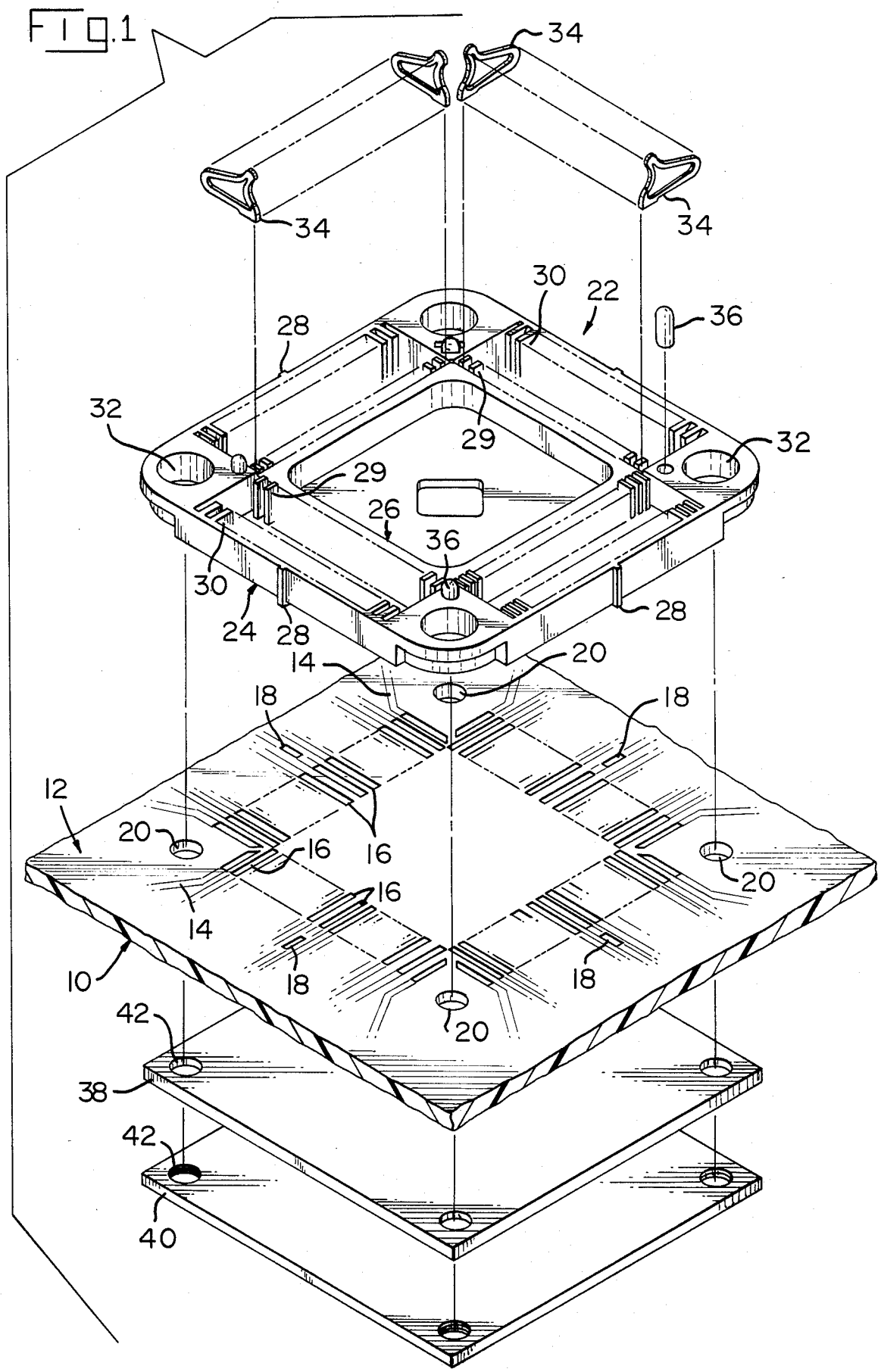
FIG. 1 is an isometric partially exploded view of the chip carrier housing, printed circuit board, and contact structure utilized with the present invention.

Referring now to FIG. 1, an isometric exploded view of a portion of the present invention may be seen. In particular there is shown a printed circuit board shown generally at 10 having printed circuit board leads 14 thereon. The printed circuit board leads 14 are electrically conductive so as to provide electrical communication with external devices (not shown). Disposed on the printed circuit board 10 is a mask 12 which has been selectively deposited and which in the preferred embodiment of the present invention is a "solder mask" and which is produced by Dupont Corporation of Delaware under the trade name of Riston Photo "Solder Mask". However, it is to be understood that equivalent films can and may be used without departing from the spirit and scope of the present invention while methods for selective depositions are well known to one skilled in the instant art. The mask 12 is disposed on the printed circuit board 10 so as to leave exposed contact areas 16 for coming into electrical contact with the contacts 34 (shown more clearly in FIGS. 4 and 5). Additionally, the mask 12 is not disposed at each of the rib locating slots 18. The rib locating slots 18 are for cooperatively engaging with the locating ribs 28. In that the mask 12, in the preferred embodiment of the present invention, is deposited to a depth of approximately 3 mils thick the ommission of a portion of the mask at the rib locating slot sections 18 provides an indentation from the generally smooth surface of the top portion of the mask 12. Therefore, a positive physical slot which is capable of visual examination allows for positive engagement of the locating ribs 28 as shown more clearly in FIG. 5. Printed circuit board mounting holes 20 are used so as to properly align the contacts 34 contained in the chip carrier housing 22 with the exposed contact areas 16 (as shown more clearly in FIGS. 3 and 4). A chip carrier housing or socket shown generally at 22 has an outer housing wall 24 and an inner housing wall 26. An inner wall contact spacing barrier 29 and an outer wall contact spacing barrier 30 are disposed opposite each other thereby forming a series of slots 32. The spacing of the slots 32 determines the center to center spacing of the contacts 34. It should be noted that the inner and outer wall contact spacing barriers 29, 30 are separate and distinct and not part of a wall contiguous as shown more clearly in FIG. 4. This space between the inner and outer wall 29, 30 minimizes any capacitive and/or inductive effects which the presence of even an insulative material may bring about. The chip carrier housing 22 is comprised of a injection molded plastic although it is to be understood that other materials and methods of manufacture may be utilized without departing from the spirit and scope of the present invention. Chip carrier housing mounting holes 33 are used to align with the printed circuit board mounting holes 20 so as to align the contacts 34 with the exposed contact area 16 (shown more clearly in FIGS. 2, 4 and 5). Locating pins 36 are disposed on the chip carrier housing 22 for alignment of a contact retainer 44 (shown in FIG. 2) which is made of plastic or any suitable non-conductive material. A spacer 38 and a lower mounting plate 40 are disposed on the other side of the printed circuit board 10 and which provide electrical isolation and heat sink properties respectively. Mounting plate holes 42 are disposed in the spacer 38 and the lower mounting plate 40, to accommodate this purpose as is shown more clearly in FIGS. 2 and 3.

Figure 2:
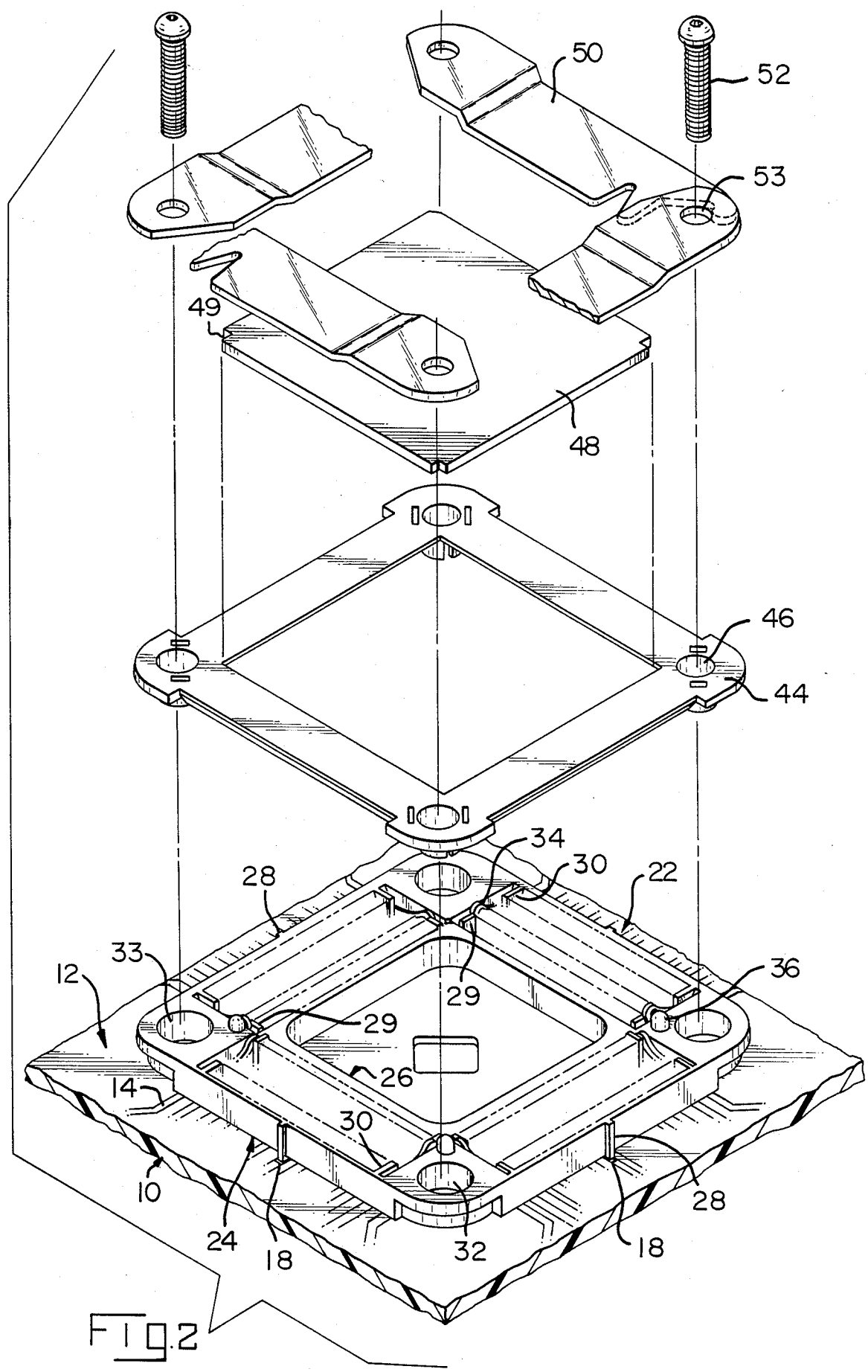
FIG. 2 is an isometric partially exploded view of the upper portion of the present invention.

Referring now to FIG. 2, there is shown an isometric exploded view of the upper portion of the present invention. Here it can be seen how the contacts 34 are disposed in the slots 32. Additionally, there is also shown the contact retainer 44 having contact retainer holes 46 disposed therein. The contact retainer 44 is used to hold the contacts 34 in their proper positions in the chip carrier housing 22. Also shown is a chip carrier or package 48 which is any suitable semi-conductor substrate. Chip carrier corner cut-outs 49 are disposed in the chip carrier 48 and which cooperatively engage with the locating pin 36 thereby providing proper positioning of contact surfaces (not shown) disposed on the underside of the chip carrier 48 and thereby allow these contact surfaces to accurately come in contact with the contact 34 and provide electrical communication therebetween. Disposed on top of the chip carrier 48 are chip carrier retaining brackets 50. The chip carrier retaining brackets 50 rigidly maintain the chip carrier 48 in contact with the contacts 34 by use of the latching slots 53 (shown more clearly in FIG. 3). Also shown are mounting screws 52 which are used to hold the entire package together (as shown in FIG. 3).

Figure 3:
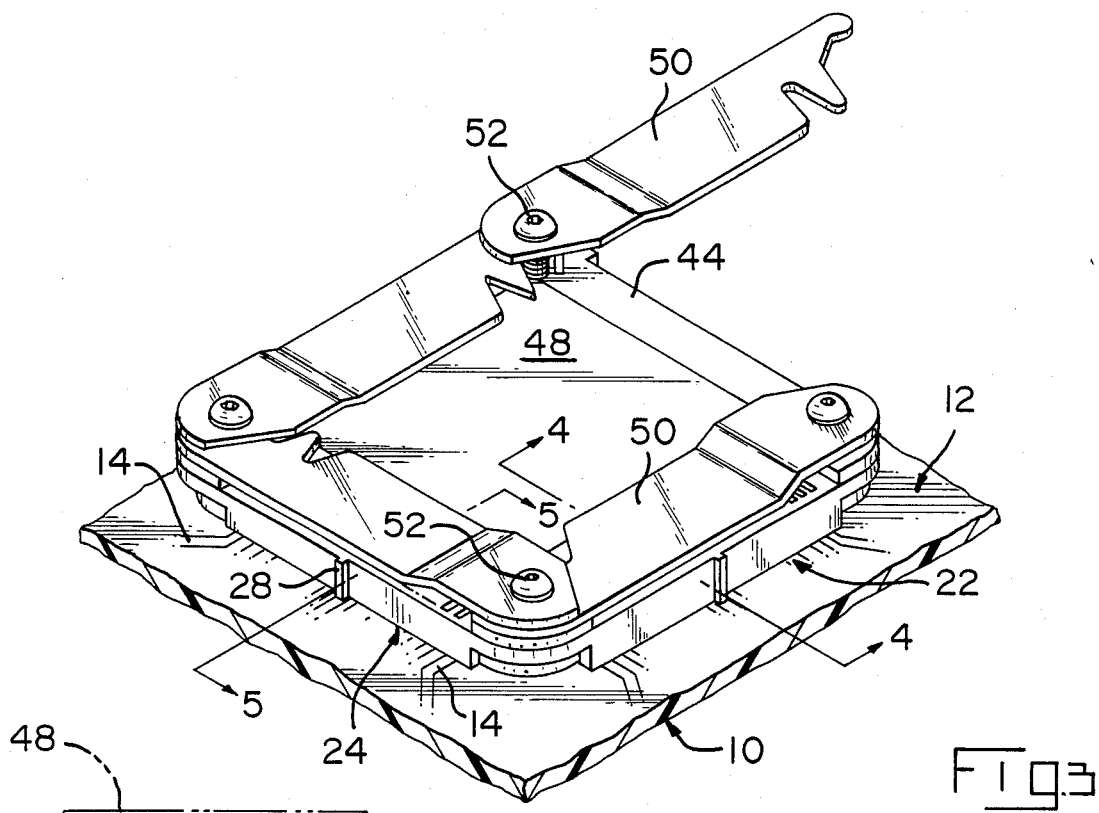
FIG. 3 is an isometric view of an assembled circuit board, chip carrier housing, and integrated circuit.

Referring now to FIG. 3 there is shown an isometric view of the assembled device of the present invention. Here it can be more clearly seen how the chip carrier 48 is retained on the chip carrier housing 22 by the retaining brackets 50. The electrical connections between the chip carrier 48, the contacts 34 (not shown), and thence the exposed contact areas 16 are of a very precise nature allowing for very little deviation therebetween. Before utilization of the present invention during assembly of similar apparatus, the chip carrier housing 22 was placed on the printed circuit board 10 with the chip 48 then placed on top of the chip carrier housing 22 and a retainer similar to contact retainer 44 placed on top of the chip carrier 48. Mounting screws 52 would then have to be inserted through the proper holes and screwed into the lower mounting plate 40 (not shown) at the same time without allowing any movement which may disturb electrical communication from the chip carrier 48 to the exposed contact area 16. However, in the present device, through the utilization of the locating ribs 28 in conjunction with the rib locating slots 18, a positive tactile feel allows the chip carrier housing 22 and the printed circuit board 10 to be aligned while inhibiting their further movement and improper alignment. The chip carrier retaining brackets 50 are then allowed to be mounted by use of the mounting screws 52 to the chip carrier housing 22 one at a time and are left relatively loose until such time as all four brackets 50 are held in place by the mounting screws 52. At this point, the chip carrier 48 is placed onto the chip carrier housing 22 thereby engaging the contacts 34. The retaining brackets 50 are then swung into place into interlocking fashion as shown with the mounting bolts 52 then tightened sufficiently for proper engagement. This, therefore, allows for easier installation of the chip carrier 48 while minimizing problems which may come about as a result of movement and therefore subsequent alignment problems between associated electrical contact surfaces.

Figure 4:
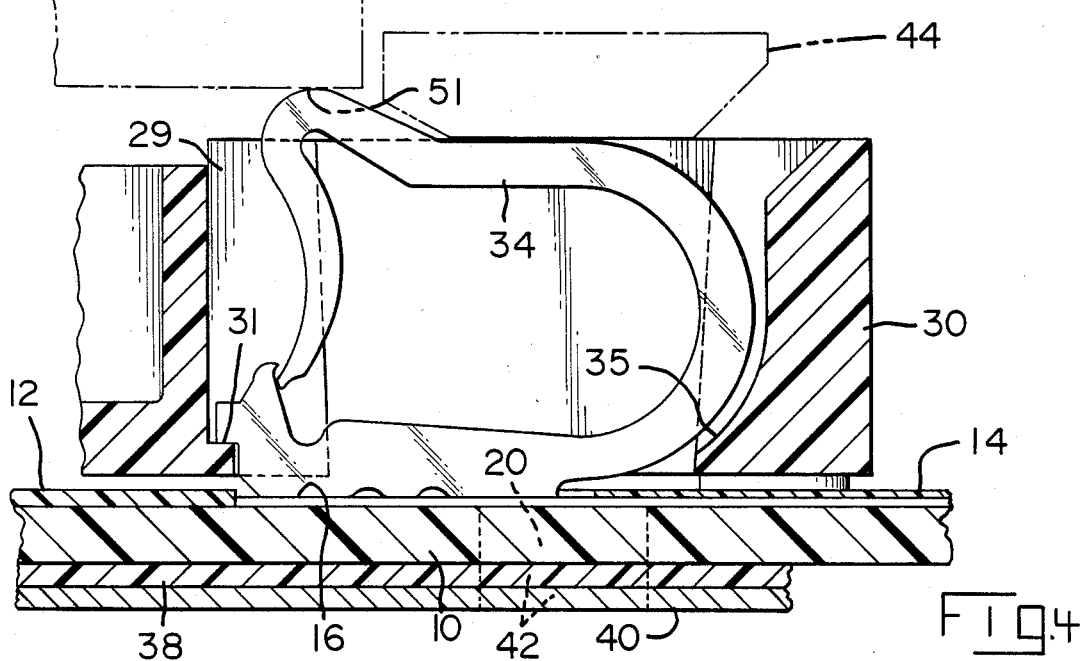
FIG. 4 is a side cross-sectional view taken through FIG. 3.

Referring now to FIG. 4 there is shown a cross-sectional view taken through 4—4 of FIG. 3. Here it can be seen how the chip carrier contact area 51 engages the contact 34. The contact 34 is held in place by the contact ledges 31, 35. Also evident is how the mask 12 has not been placed over the exposed contact area 16 thereby allowing the level portion of the contact 34 to be electrically connected to the exposed contact area 16 and in the preferred embodiment of the present invention, would then be soldered using commonly known techniques such as reflow soldering, although it is to be understood that other soldering methods may be used as well as no solder. Also shown is the contact retainer 44 which maintains contact 34 in place.

Figure 5:
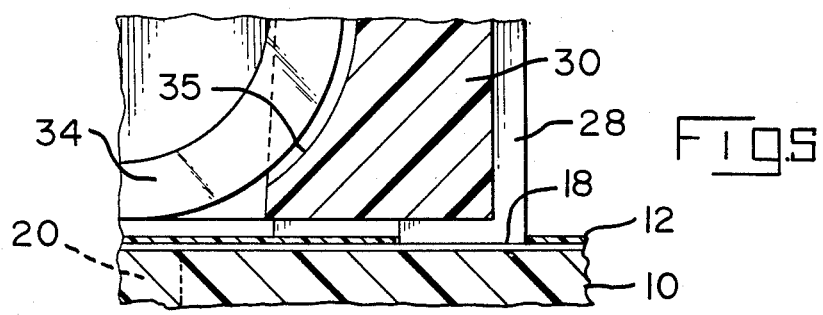
FIG. 5 is a partial side cross-sectional view taken through FIG. 3 showing one of the locating ribs of the present invention.

Referring now to FIG. 5 there is shown a cross-sectional view taken through 5—5 of FIG. 3 showing the locating rib 28 and how it is disposed in the rib locating slot 18. Therefore, as mentioned earlier this thereby add tactile feel to the mounting procedure as well as being readily visually inspectable.

It is to be understood that many variations of the present invention may be utilized without departing from the spirit and scope of the present invention. For example, different contacts may be utilized as well as different chip carrier housing arrangements which are perhaps, for example, rectangular. Further, different thicknesses of the mask may be utilized while more or fewer ribs having different spacing may be used. Additionally, the contact ledges 31, 35 may be of a different configuration or eliminated. Further, different means of retaining the contacts in the chip carrier housings other than the contact retainer may be utilized such as, for example, maintaining the contact retainer as an integral part of the chip carrier housings with the contacts forced into appropriate positions. Also other types of circuit boards may be used such as circuit conductors secured by plating. Further, the number or size of the relating brackets may be altered or other means of fastening the brackets to the board may be used.

Therefore, in addition to the above enumerated advantages the disclosed invention produces a device which is relatively inexpensive, requiring relatively few individual components as well as providing for ease of utilization.

We claim:

1. A device for connecting a leadless integrated circuit chip carrier or package to a circuit board, comprising:
   a circuit board having electrical conductors contained thereon;
   mask means disposed on said circuit board thereby covering said electrical conductors contained thereon, said mask being selectively omitted from at least one portion of said circuit board thereby leaving exposed contact area on said electrical conductors and thereby defining a rib locating slot;
   generally rectangular chip carrier housing means disposed on said circuit board for receiving a leadless integrated circuit chip carrier, said housing means having outer walls and interior walls said interior walls attached to said outer walls at each corner of said chip carrier housing;
   outer and interior spacing barrier wall means in opposing relationship to each other disposed perpendicularly to said outer and said interior walls thereby defining a slot for receiving an electrically conductive contact and forming a space between outer and interior spacing barrier walls so as to minimize stray inductance and capacitance between electrical contacts disposed in adjacent slots;
   an electrically conductive contact disposed in each of said slots for providing electrical communication between a leadless integrated circuit chip carrier and said electrical conductors contained on said circuit board;
   at least one locating rib means disposed on said chip carrier housing means for engageably engaging said rib locating slot thereby allowing proper alignment of said contacts contained in said housing means with said electrical conductors contained on said circuit board;
   a leadless integrated circuit chip carrier disposed on said housing means; and
   a plurality of chip carrier retaining bracket means disposed on said housing means for maintaining conductors contained on said integrated circuit chip carrier in aligned electrical contact with said contacts contained in said chip carrier housing means, said retaining brackets being generally rectangular and each of which is pivotally attached at one end to said chip carrier housing means and having latching slots at the remaining end for interlocking with pivot points of adjacent chip carrier retaining brackets.

2. A device for connecting a leadless integrated circuit chip carrier or package to a circuit board, comprising:
   a circuit board having electrical conductors contained thereon;
   mask means disposed on said circuit board thereby covering said electrical conductors contained thereon, said mask being selectively omitted from at least one portion of said circuit board thereby leaving exposed contact areas on said electrical conductors and thereby defining a rib locating slot;
   chip carrier housing means disposed on said circuit board for receiving a leadless integrated circuit chip carrier, said housing means having electrically conductive contacts contained therein for providing electrical communication between said leadless integrated circuit package and said electrical conductors contained on said circuit board;
   at least one locating rib means disposed on said chip carrier housing means for engageably engaging said rib locating slot thereby allowing proper alignment of said contacts contained in said housing means with said electrical conductors contained on said circuit board;
   a leadless integrated circuit chip carrier disposed on said housing means; and
   a plurality of chip carrier retaining bracket means disposed on said housing means for maintaining conductors contained on said integrated circuit chip carrier in aligned electrical contact with said contacts contained in said chip carrier housing means, said retaining brackets being generally rectangular and each of which is pivotally attached at one end of said chip carrier housing means and having latching slots at the remaining end for interlocking with pivot points of adjacent chip carrier retaining brackets.

3. A device for connecting leadless integrated circuit chip carrier or package to a circuit board, comprising:
   a circuit board having electrical conductors contained thereon;
   generally rectangular chip carrier housing means disposed on said circuit board for receiving a leadless integrated circuit chip carrier, said housing means having outer walls and interior walls, said interior walls attached to said outer wall at each corner of said chip carrier housing;
   outer and interior spacing barrier wall means in opposing relationship to each other disposed perpendicularly to said outer and said interior walls thereby defining a slot for receiving an electrically conductive contact and forming a space between said outer and interior spacing barrier walls so as to minimize stray inductance and capacitance between electrical contacts disposed in adjacent slots;
   an electrically conductive contact disposed in each of said slots for providing electrical communication between a leadless integrated circuit chip carrier and said electrical conductors contained on said circuit board;
   a leadless integrated circuit chip carrier disposed on said housing means; and
   a plurality of chip carrier retaining bracket means disposed on said housing means for maintaining conductors contained on said integrated circuit chip carrier in aligned electrical contact with said contacts contained in said chip carrier housing means, said retaining brackets being generally rectangular and each of which is pivotally attached at one end of said chip carrier housing means and having latching slots at the remaining end for interlocking with pivot points of adjacent chip carrier retaining brackets.

4. A device according to claims 1 or 2 or 3 wherein said circuit board is a printed circuit board.

5. A device according to claim 1 or 2 or 3 wherein said chip carrier housing means is comprised of an electrically insulating material.

6. A device according to claim 1 or 2 or 3 wherein said chip carrier housing is comprised of plastic.

7. A device according to claim 1 or 2 wherein four equally spaced locating ribs are disposed o said chip carrier housing means for engageably mating with four similarly positioned rib locating slot.

* * * * *